United States Patent
Zumkehr et al.

(10) Patent No.: US 7,036,053 B2
(45) Date of Patent: Apr. 25, 2006

(54) TWO DIMENSIONAL DATA EYE CENTERING FOR SOURCE SYNCHRONOUS DATA TRANSFERS

(75) Inventors: John F. Zumkehr, Orange, CA (US); John L. Bryan, Beaverton, OR (US); Howard S. David, Portland, OR (US); Klaus Ruff, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 519 days.

(21) Appl. No.: 10/324,864

(22) Filed: Dec. 19, 2002

(65) Prior Publication Data
US 2004/0123207 A1    Jun. 24, 2004

(51) Int. Cl.
*G01R 31/3183* (2006.01)

(52) U.S. Cl. .............. 714/709; 714/719; 714/721; 714/744

(58) Field of Classification Search ..... G01R 31/3183
See application file for complete search history.

(56) References Cited

U.S. PATENT DOCUMENTS

| 3,633,174 | A | | 1/1972 | Griffin ................. 340/172.5 |
| 3,656,106 | A | * | 4/1972 | Stein ........................ 714/709 |
| 5,764,703 | A | | 6/1998 | Charvin et al. ............ 375/311 |
| 6,118,731 | A | | 9/2000 | Huang et al. .............. 365/233 |
| 6,480,946 | B1 | | 11/2002 | Tomishima et al. ........ 711/167 |
| 2001/0014922 | A1 | | 8/2001 | Kuge ........................ 710/36 |
| 2002/0138800 | A1 | * | 9/2002 | Kim et al. |
| 2003/0226070 | A1 | * | 12/2003 | Fukao et al. ............... 714/700 |

* cited by examiner

*Primary Examiner*—R. Stephen Dildine
(74) *Attorney, Agent, or Firm*—Pillsbury Winthrop Shaw Pittman LLP

(57) ABSTRACT

A method for optimizing a source synchronous clock reference signal timing to capture data from a memory device (e.g., DDR SDRAM) includes conducting an iterative two-dimensional data eye search for optimizing the delay of the source synchronous clock reference signal (e.g., DQS). Embodiments of the present invention are directed to tuning the delay for each device for the optimal margin in two dimensions: maximize the distance from the data eye walls and maximize the noise margin on the interface. An iterative data eye search is performed while varying the DQS delay timing and noise margin.

36 Claims, 10 Drawing Sheets

Data Eye for DDR

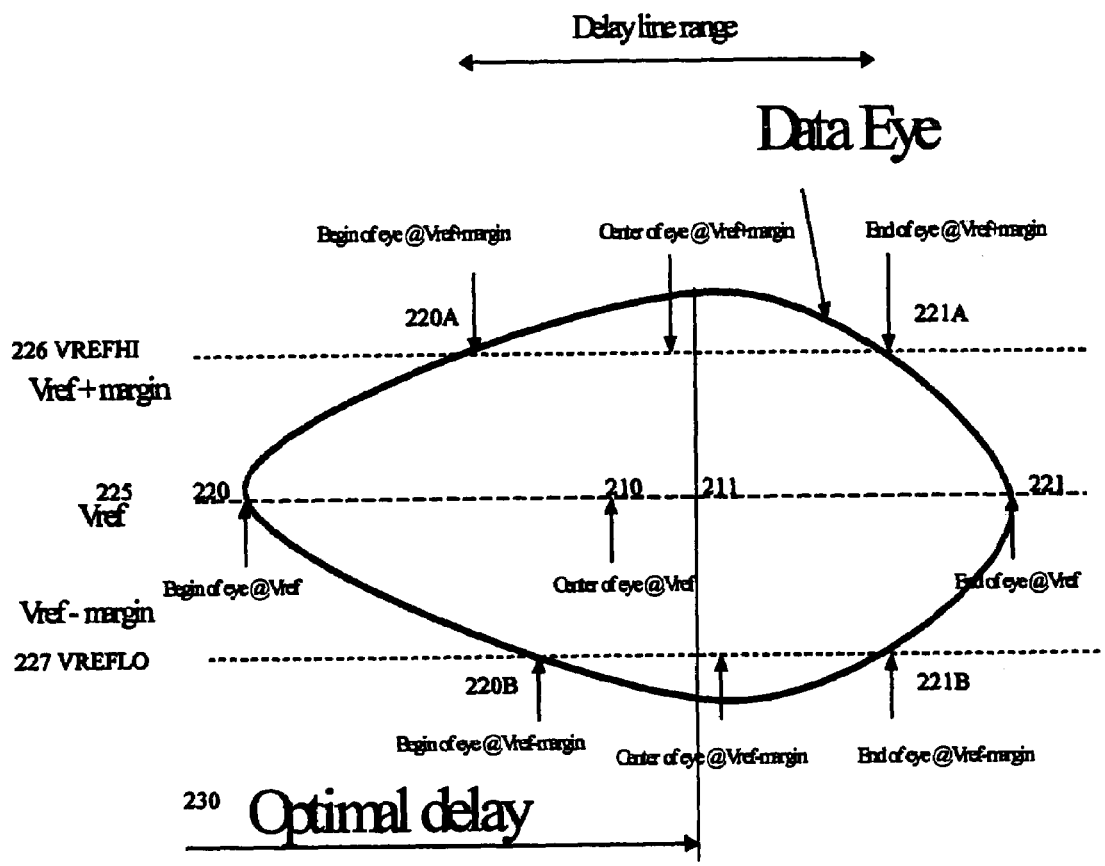
FIG. 2B: Data Eye for DDR

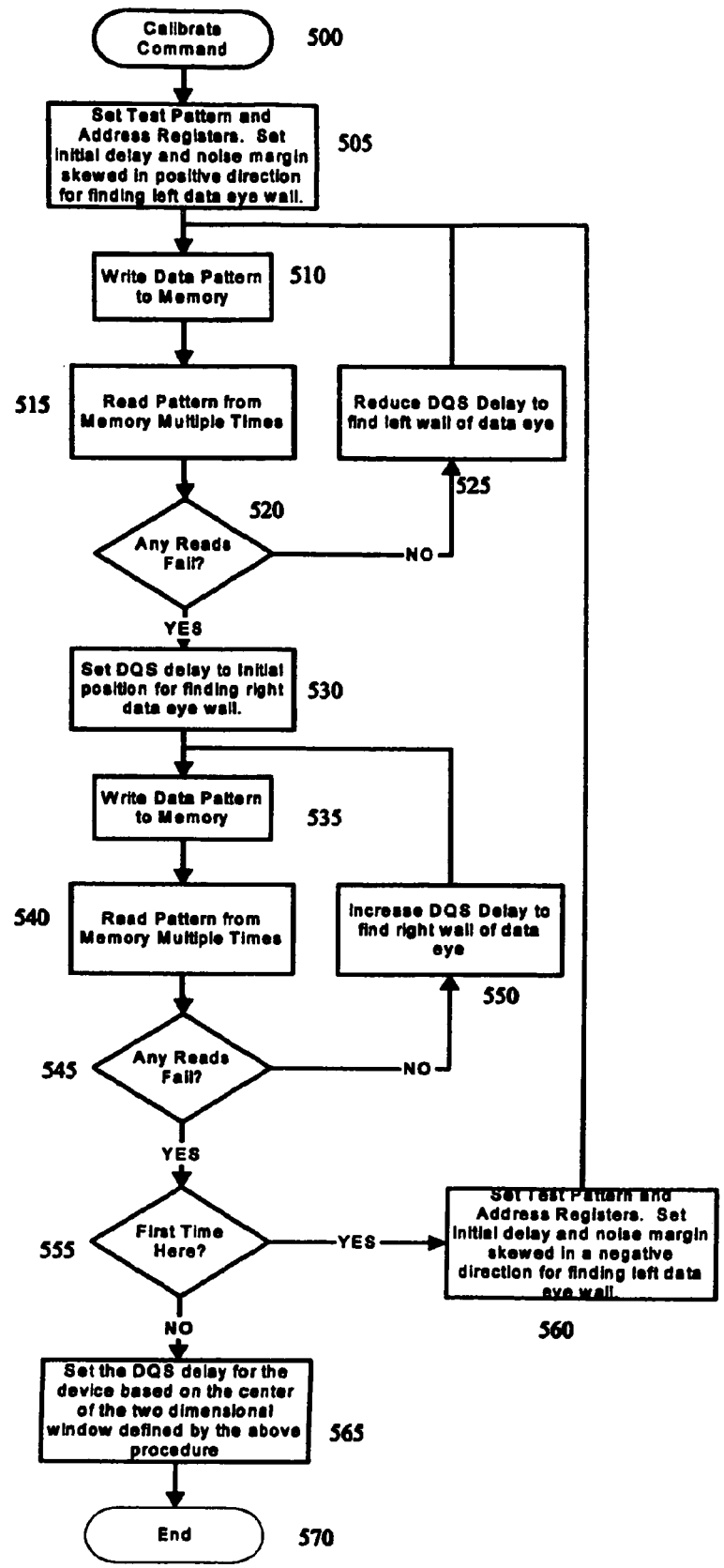
FIG. 5 DDR Device Calibration Algorithm

TWO DIMENSIONAL DATA EYE CENTERING FOR SOURCE SYNCHRONOUS DATA TRANSFERS

BACKGROUND OF THE INVENTION

1. Field of the Invention

The present invention relates to source synchronous data transfers, and more particularly, to a method and apparatus for optimizing source synchronous data transfers.

2. Discussion of the Related Art

Source synchronous data transfer schemes have been used to increase data transfer rates as compared to common clocked data transfer schemes. While common clocked data transfer schemes use a common clock signal for devices on the sending and receiving ends of a data transfer, in source synchronous data transfer schemes, the sending device provides one or more strobe signals with the data being transferred. The receiving device uses the strobe signal to sample the incoming data.

In order to maximize data transfer, the sampling point as determined by the strobe signal should be in the center of the data time period. This provides a setup margin of one-half data period and a hold margin of one-half data period. The strobe signal can be centered by the sending device or by the receiving device.

For example, Double Data Rate (DDR) memory devices use source synchronous transfers when data is read from the memory devices. Referring to FIG. 2A, a single ended data strobe signal (DQS) 110 is sent along with the data (DQ) 120 to be clocked to a memory controller. The DQS signal 110 is edge-aligned with the DQ signal 120 for read cycles and center-aligned with the DQ signal 120 for write cycles. The DQS signal 110 must be delayed relative to the DQ signal 120 to capture the data DQ 120 when it is valid and stable. For example, to capture the data 120 using the DQS signal 110 in a flip-flop, the DQS signal 120 needs to be delayed (delayed DQS 130) relative to the data 120 to satisfy the data set-up and hold time requirement of the flip-flop.

Referring to FIG. 6, ideally, DQ data signals should be detected by the memory controller at a time t1 during the data cycle with the period T. Time t1 corresponds to the center of the data cycle and it provides maximum timing margin, ½T, for data detection between data transition periods. When the DQS transition occurs in the center of the data cycle, the ideal optimal delay value has been found. FIG. 6 illustrates this ideal relationship between the data signal and the clock strobe signal.

A DQ data signal 120 transmitted so that it aligns ideally with respect to a delayed DQS signal 130 may arrive at the receiving device early or late with respect to the delayed DQS signal 130. In some circumstances, the best DQ data receive time may be at a point within the data cycle, other than the center, due to mismatches between the DQ and DQS paths.

Furthermore, the best delay for each DQS to provide the most capture margin is not necessarily in the center of the data cycle due to memory controller receiver circuit and board skew effects. Board topology may give rise to an undesired timing skew between the DQS signal and DQ data signals as they propagate from the DDR SDRAM to the memory controller.

Additionally, corruption of data transmitted via the Bus results not only from static characteristics, but also from data dependent phenomenon such as residual and cross-coupled signals. Residual signals on the Bus result from past transmissions on the same channel, and tend to reduce voltage and timing margins on the channel from one sampling interval to the next. Cross-coupled signals result from inductive coupling of signals on neighboring channels, rather than from past signals on the same channel. Cross-coupled signals also tend to reduce voltage and timing margins on the channel from one sampling interval to the next. Voltage margin as used herein refers to the signal integrity of the DQ and DQS signals in meeting requirements of a electrical bus specification such as the JEDEC SSTL_1.8 for DDR II.

FIG. 7A is a block diagram illustrating a prior art receiver 10. Input receiver 110 has a reference potential input terminal receiving a signal VREF 105 serving as a reference for determining whether an input signal is a high level signal or a low level signal. A typical receiver uses a comparator with a VREF signal configured midway between a high input voltage (VIH) and a low input voltage (VIL). The VREF signal is a high impedance DC voltage reference which tracks loosely with power supplies over time, but cannot respond to instantaneous noise. Conventionally, High Output Voltage (VOH) and Low Output Voltage (VOL) denote signals emerging from the transmitting source, and VIL and VIH denote signals arriving at the input of the receiving device, although they can be considered the same signal.

A VREF signal 105 is coupled to each internal receiver 110. VREF is typically generated from the device power supply (not shown) using a voltage divider resistor network. FIG. 7B is a timing diagram 125 illustrating an example signal relative to a high reference voltage (VREFh) and a low reference voltage (VREFl). The VREFh and VREFl values typically depend on power supply variation used to generate the VREF signal. The large voltage swing, i.e., the difference between a high voltage signal (VIH) and a low voltage signal (VIL), and stable signal levels above and below the VREF signal are required for reliable detection of signal polarity. The voltage swing of current single-ended signaling technologies is conventionally around 0.8 v.

BRIEF DESCRIPTION OF THE DRAWINGS

FIG. 2B illustrates an optimal delay relative to a data eye shape according to an embodiment of the invention;

FIG. 5 illustrates a flow chart diagram of a method for DDR device calibration using an algorithm according to an embodiment of the invention;

DETAILED DESCRIPTION

Data transfers are referred to as source synchronous when the clock (or strobe) signal that latches the data is supplied by the same chip (a driver) that is driving the data. With source synchronous data transfers, the same process, temperature, and voltage variations affect both the data and clock timings, and a multi-chip system may not need additional timing margin to account for independent variation in these variables along the clock and data paths.

Strobe signals are clock signals that are transmitted with data signals, either simultaneously or after a predetermined delay. The strobe signal is used to time-synchronize data appearing as input signals at a receiver from a driver (transmitter). The use of the strobe signal to indicate when data should be sampled avoids using a clock which is sent to both driver and receiver. If this latter technique is used, then the skew between the two versions of the clock (transmitter and receiver) must be added to the time that each bit is driven from the driver, slowing it down. Sending the clock along with the data may eliminate this skew by using the transmitter's clock both to send the data and to send the strobe.

Figure 1A:
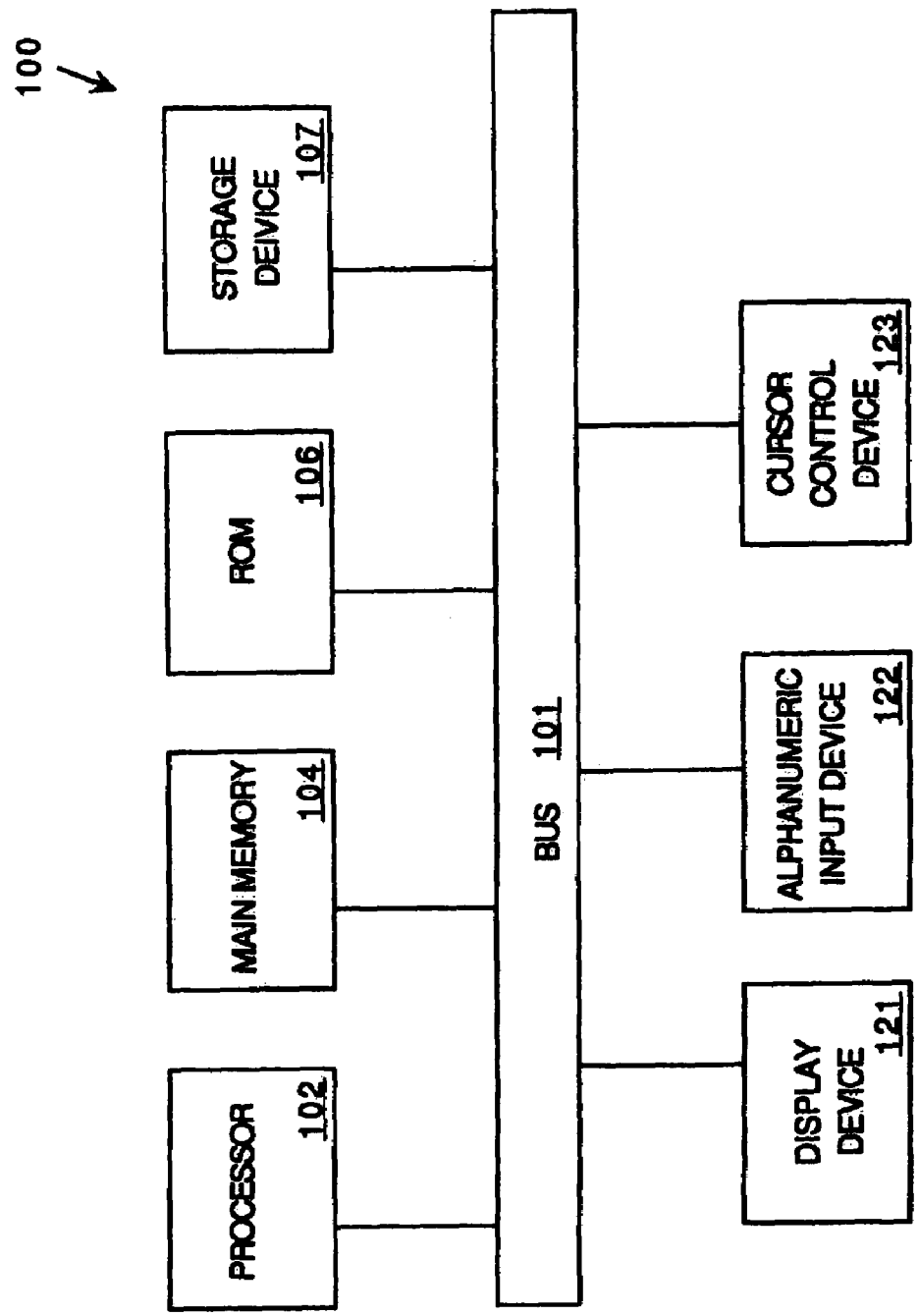
FIG. 1A illustrates a block diagram of a computer system suitable for use with an embodiment of the invention.

FIG. 1A is a block diagram of a computer system suitable for use with the invention. Computer system 100 comprises bus 101 or other device for communicating information, and processor 102 coupled with bus 101 for processing information. Computer system 100 further includes random access memory (RAM) or other dynamic storage device 104 (referred to as main memory), coupled to bus 101 for storing information and instructions to be executed by processor 102. Main memory 104 also can be used for storing temporary variables or other intermediate information during execution of instructions by processor 102. Computer system 100 also comprises read only memory (ROM) and/or other static storage device 106 coupled to bus 101 for storing static information and instructions for processor 102. Data storage device 107 is coupled to bus 101 for storing information and instructions.

Data storage device 107 such as magnetic disk or optical disc and corresponding drive can be coupled to computer system 100. Computer system 100 can also be coupled via bus 101 to display device 121, such as a cathode ray tube (CRT) or liquid crystal display (LCD), for displaying information to a computer user.

Alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121.

In one embodiment, processor 102 and one or more of the components coupled to bus 102, such as main memory 104, are source synchronous components. Of course, any one or more components of computer system 100 can be source synchronous. Thus, computer system 100 can be either a partially source synchronous or fully source synchronous environment. In one embodiment, computer system 100 is a differential-strobe source synchronous system in which complementary strobe signals are communicated in parallel with data signals over the bus. Alternatively, computer system 100 is a single-strobe source synchronous system in which a single strobe signal is communicated in parallel with data signals over the bus.

Figure 1B:
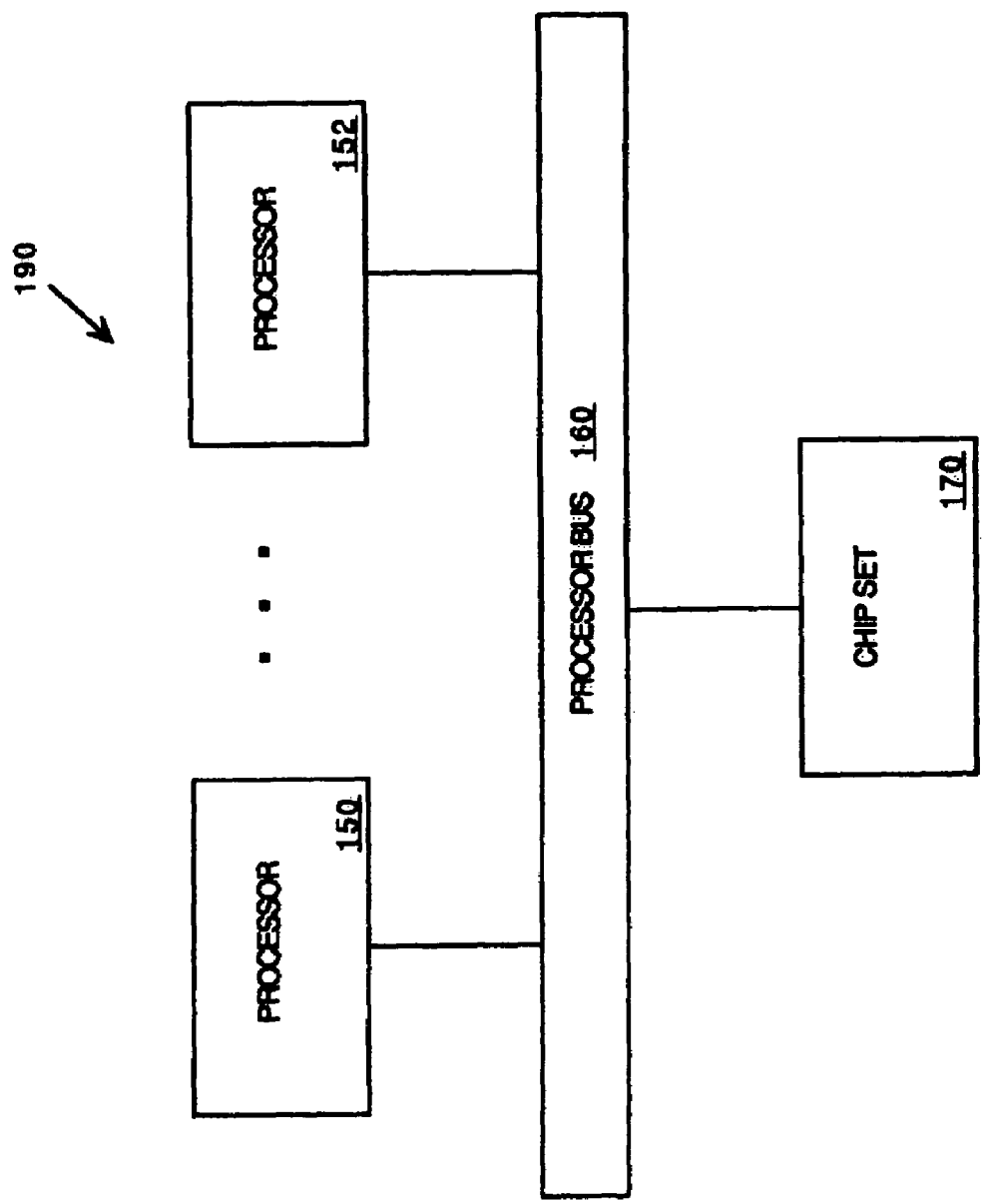
FIG. 1B illustrates a block diagram of a multi-processor computer system suitable for use with an embodiment of the invention.

FIG. 1B is a block diagram of a multi-processor computer system suitable for use with the invention. Computer system 190 generally includes multiple processors (e.g., processor 150 through processor 152) coupled to processor bus 160. Chip set 170 provides an interface between processor bus 160 and other components of computer system 190, such as a system bus (not shown in FIG. 1B). Other system components, such as those described with respect to computer system 100 can be coupled to the system bus.

Computer system 190 is a higher performance system than computer system 100 in both bus architecture and number of processors. In one embodiment, processor bus 160 communicates information in a source synchronous manner. Processors 150 and 152 can be any type of processor. Data transfer from processor 150 to processor 152 may involve transfer between registers or cache memory. In one embodiment, processors 150 and 152 are from the Intel Corporation family of processors. Chip set 170 provides an interface between processor bus 160 and the remaining components of computer system 190 in any manner known in the art.

Several types of bus architectures use source synchronous data transfers, e.g., multi-drop or point-to-point processor busses, multi-drop or point-to-point I/O busses, memory busses, Accelearated Graphics Port (AGP) busses, RAMBUS, etc. In addition, several memory devices operate using source synchronous data transfers, e.g., double data rate synchronous dynamic random access memories (DDR SDRAM), quad data rate (QDR) devices, Rambus dynamic random access memory (RDRAM), registers, cache memory, etc.

Embodiments of the present invention may be applicable to any source synchronous data transfer between entities. The present invention is described in further detail using an embodiment directed to the source synchronous data transfer between a Double Data Rate (DDR) device and a memory controller. However, it is understood that the present invention may apply to all source synchronous data transfers.

A Double Data Rate (DDR) devices use a source-synchronous clocking protocol to transfer data from a memory to a memory controller. DDR memory devices may include double data rate synchronous dynamic random access memories (DDR SDRAM). The DDR SDRAM uses a double data rate architecture to achieve high-speed operation. The double data rate architecture transfers two data words per clock cycle at the I/O pins. In a typical DDR SDRAM, a bi-directional data strobe (DQS) signal is transmitted externally, along with the data (DQ) signal, for use in data capture at the receiver. The DQS signal is a strobe transmitted by the DDR SDRAM during a read cycle and by a memory controller during a write cycle. Double Data Rate II (DDRII) devices also use a source-synchronous clocking protocol to transfer data from a memory to a memory controller. For DDRII devices a differential strobe signal DQS and DQS# is used. With a differential strobe the crossing of DQS going high and DQS# going low will be referred to as the positive edge of the strobe signal.

Figure 2A:
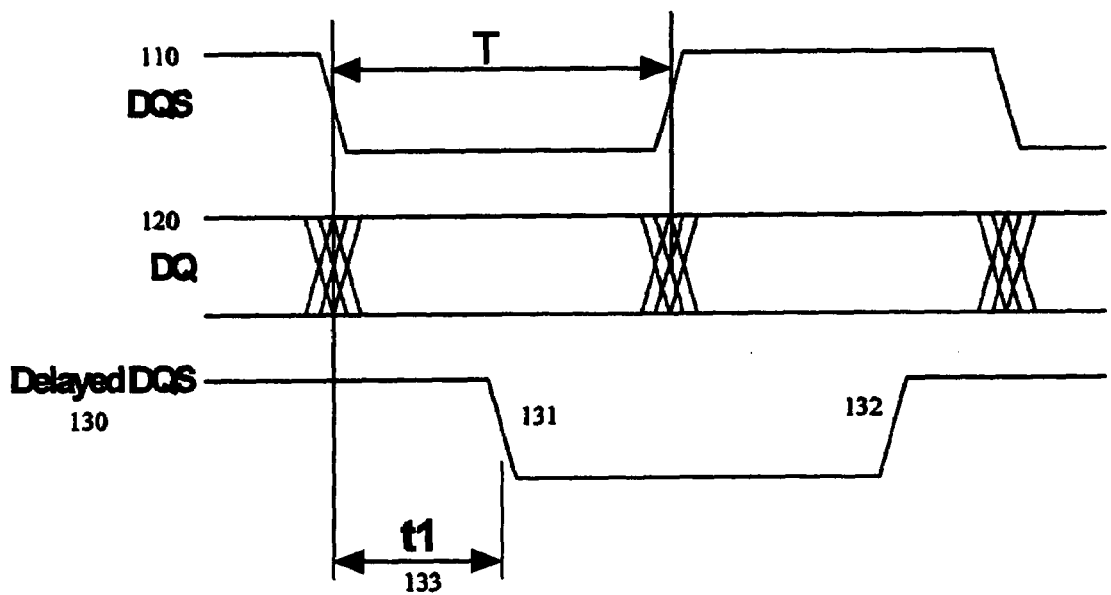
FIG. 2A illustrates a timing diagram containing DQS, DQ, and delayed DQS signals according to an embodiment of the invention.

Referring to FIG. 2A, each DQS 110 from memory is delayed as shown (delayed DQS 130) so that data DQ 120 can be clocked where the data may be valid and stable. In DDR memory devices, the best delay for each DQS to provide the most capture margin is not necessarily in the center of the window due to receiver circuit and board skew effects. The "data eye" shape for DDR devices as shown in FIG. 2B illustrates this point.

As used herein, "data eye" refers to the eye shaped, closed curve defined in a two dimensional space with the DQS delay value as the x-axis and the reference voltage VREF as the y-axis. Any point within the data eye indicates a combination of DQS delay value and reference voltage VREF that results in valid data while points outside the data eye result in invalid data.

With this data eye shape, the center of the data eye 210 with respect to the data eye edges 220, 221 has a reduced noise margin. As used herein, noise margin refers to the amount of variation in VREF i.e., VREFHI and VREFLO that will result in valid data points within the area encompassed by the "data eye" curve. The optimal delay 230 for the DQS 130 would be such that a rising or falling edge of a pulse 131, 132 of the delayed DQS 130 occurs in the portion of the data eye 211 that has the most noise margin as well as the most distance from the walls 220, 221 of the data eye.

Current methods for finding the optimal clocking point for DDR interfaces conduct a data eye search only by detecting the data eye walls and setting the clocking point in the middle. However, as the data transfer rate goes up, a data eye search preferably adds a noise margin search to determine the optimal clocking point.

Traditional techniques for setting the optimal DQS delay use an open loop method or an iterative method to detect the data eye walls. In the open loop method, the delay setting is based on the average ideal delay that is obtained through experimentation or experience. This method produces poor margins because DDR device characteristics can vary causing the data eye to shift. Methods that try to detect the data eye wall and set the delay in the middle work well but do not put the DQS in the broadest part of the eye. Both of these methods fail to place the data strobe at the optimal point.

Embodiments of the present invention are directed to tuning the DQS delay for each DDR device for the optimal margin in two dimensions: maximize the distance from the data eye walls and maximize the noise margin on the interface. To accomplish this, an iterative data eye search is performed while varying the DQS delay timing and noise margin.

Figure 3:
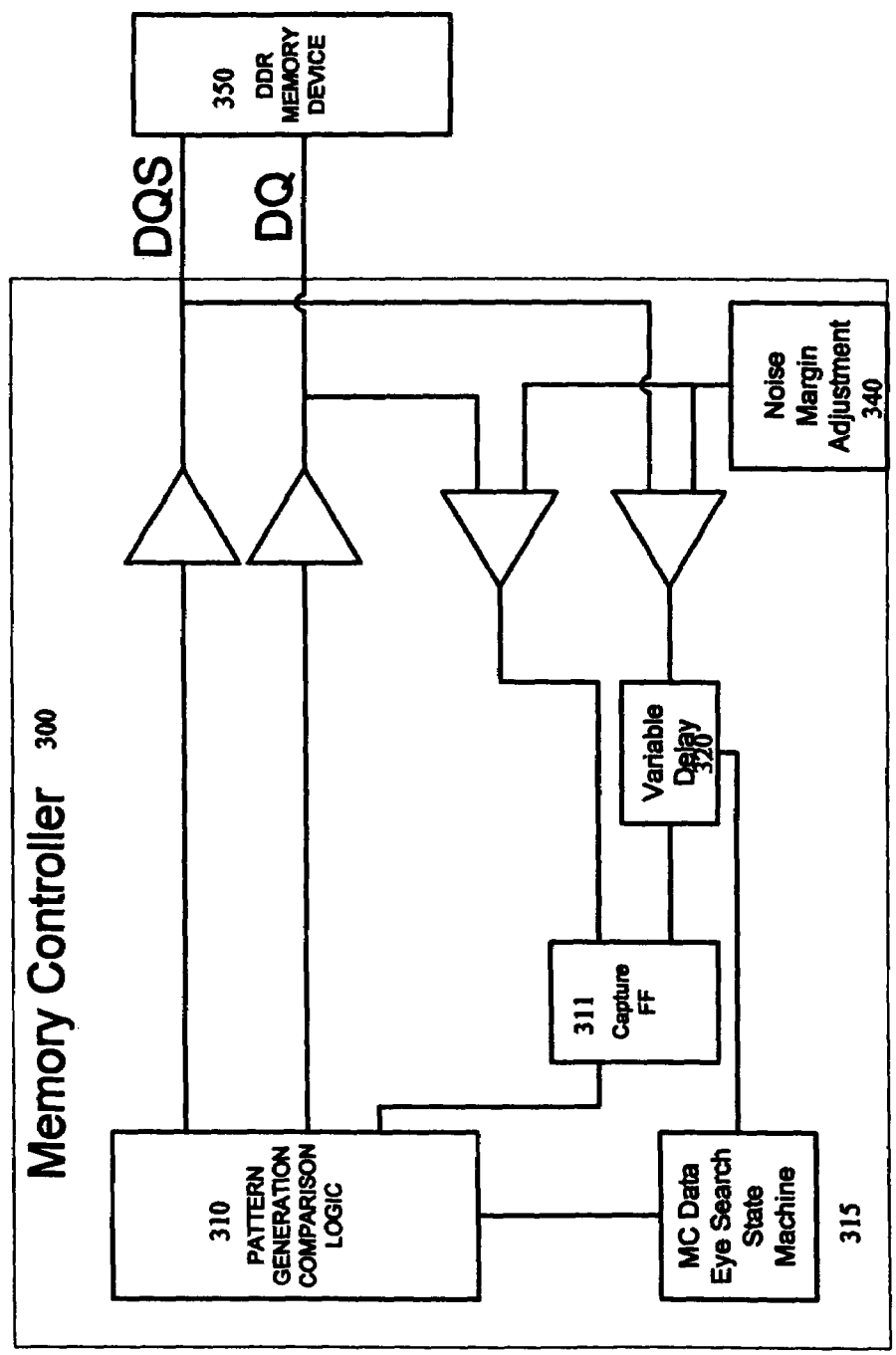
FIG. 3 illustrates a memory controller and a DDR memory device according to an embodiment of the invention.

FIG. 3 illustrates a block diagram of a memory controller and a DDR memory device for tuning the DQS delay according to embodiments of the present invention. A memory controller (MC) 300 contains logic to write and read patterns to and from a DDR memory device 350 to assist in determining the optimal DQS delay setting for each DDR memory device 350. The MC 300 has registers 310 in the Pattern Generation and Comparison Logic 310 section that contain the patterns to be written to memory 350 and to be used in comparison on data read back from memory 350. These patterns can be set for low crosstalk or high crosstalk data patterns to provide flexibility in finding the data eye. When the MC 300 reads data back from the memory devices 350, the data is captured by capture flip flop 311 and is compared with expected data. A flag is set if the read back data does not match the expected data. These data points would fall outside the area enclosed by the data eye illustrated in FIG. 2B.

MC Data Eye Search State Machine 315 contains a two-dimensional data eye search algorithm for DDR devices according to embodiments of the present invention. The noise margin testing may involve using a high 226 and low 227 VREF threshold as shown in the FIG. 2B or a more thorough sweep of VREF voltages if needed (as represented by the 2-dimensional data eye profile).

Variable Strobe Delay Element 320 allows adjustment of the strobe delay so that the memory data can be captured anywhere within the data eye. The range of delay variation is preferably capable of reaching both sides of the data eye wall. In an embodiment of the present invention, the data eye search may be performed at the margined VREFHI 226 and VREFLO 227 levels, which is advantageous, in that the range of delay variation required is smaller than the range required for a data eye search performed at the VREF 225 level. When searching the data eye, including a search at VREF 225, the range of delay variation implemented in a silicon device may cover the expected range from the beginning of the data eye 220 to the end of the data eye 221. When searching the data eye at the margins VREFHI 226 and VREFLO 227, the range of delay variation implemented in the silicon device may only cover the expected range from the beginning of the data eye at the margin, which is the earlier of 220A and 220B, to the end of the data eye at the margin, which is the later of 221A and 221B. Reducing the range of delay variation may reduce transistor count, the number of control signals and the power dissipated by the delay cell.

Figure 4A:
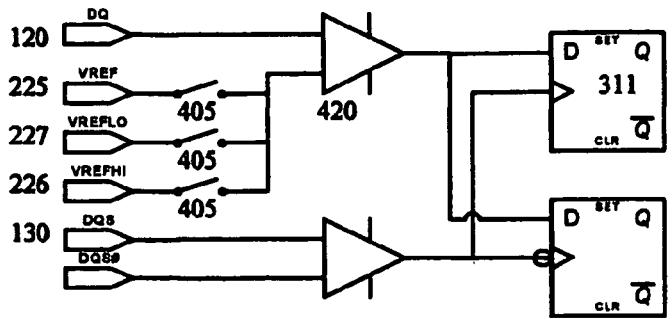
FIGS. 4A, 4B and 4C illustrate noise margin search mechanisms according to embodiments of the invention.
Figure 4B:
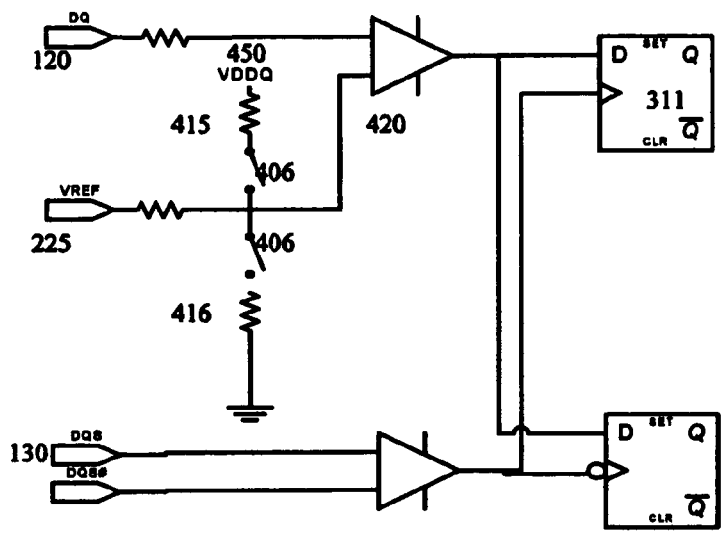

Noise Margin Adjustment Mechanism 340 allows the noise margin on the data from memory to be skewed in a positive and/or negative direction. Embodiments of the present invention are shown in FIG. 4. One implementation of this mechanism is to modify the VREF voltage 225 going to the DQ receivers such that the threshold is raised or lowered. This can be done as shown in FIG. 4A by opening or closing switches 405 (internal or external to the memory controller 300) to connect externally generated voltages VREF 225, VREFHI 226, and VREFLO 227. Or as shown in FIG. 4B, the external VREF may be skewed to provide high and low thresholds by opening or closing switches 406 connected to pullup resistor 415 tied to VDDQ 450, or pulldown resistor 416 tied to ground. Pullup resistor 415 tied to VDDQ 450 and pulldown resistor 416 may be internal to the memory controller 300 or located externally on a circuit board under control of the memory controller 300.

Figure 4C:
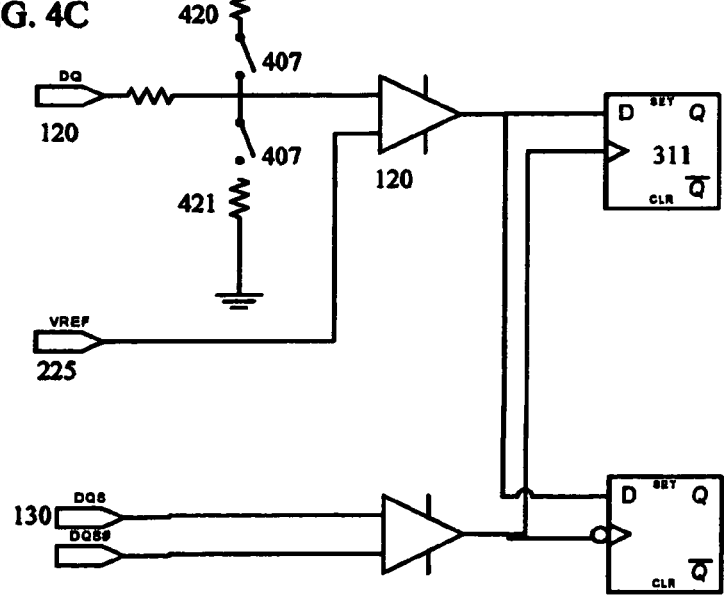
Figure 6:
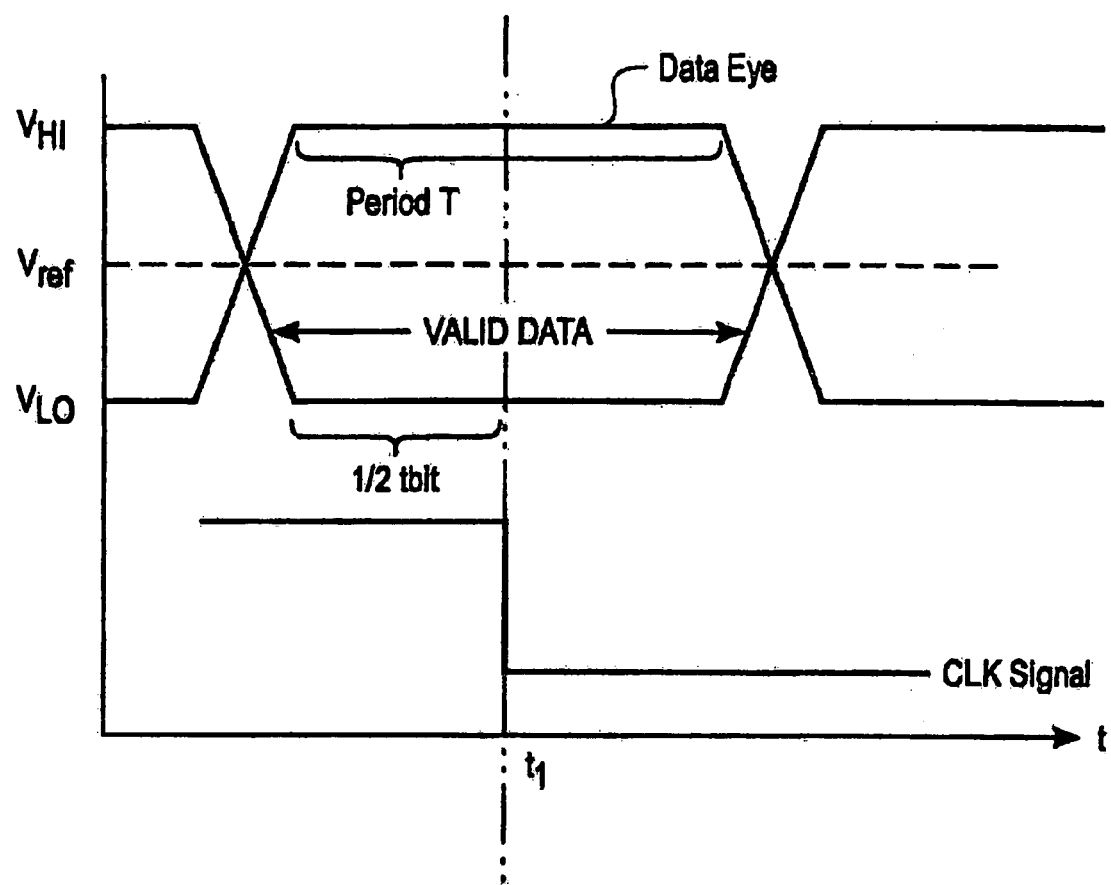
FIG. 6 illustrates an ideal relationship between the DQ data signal and the DQS strobe signal.
Figure 7A:
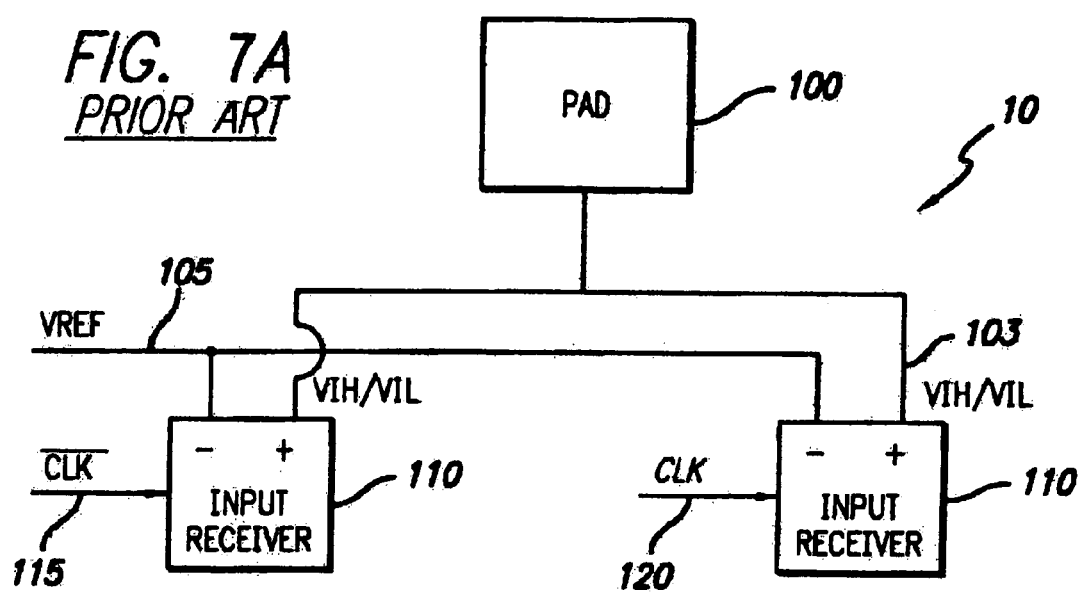
FIG. 7A is a block diagram illustrating a prior art receiver.
Figure 7B:
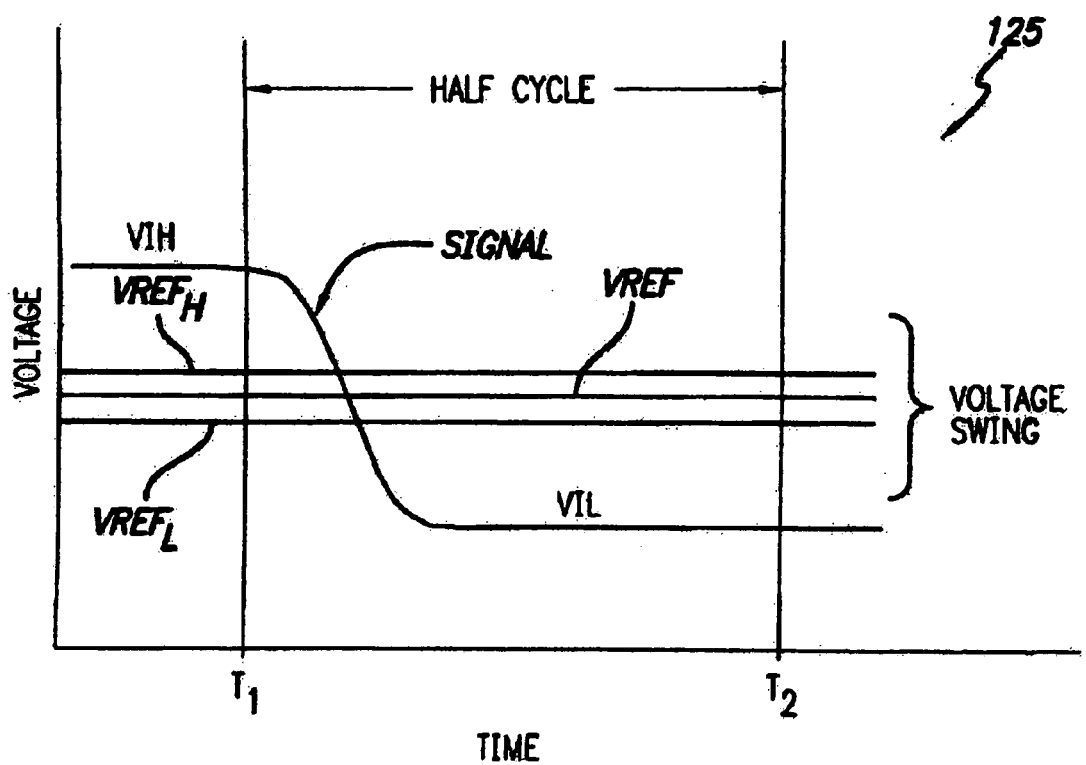
FIG. 7B is a prior art timing diagram illustrating an example signal relative to a high reference voltage (VREFh) and a low reference voltage (VREFl).

FIG. 4C illustrates an alternative method of implementing this mechanism wherein the data signal DQ 120 is skewed by adjusting the on-die resisters connected to the DQ pads. On-die termination may take place in the memory controller 300 or in the DDR memory device 350. Normally the on-die resistors 420, 421 are of equal value and tied to the DDR memory device 350 or memory controller 300 power supply rails. However, if the resistors 420, 421 are made unequal, the data signal DQ 120 (noise margin) can be skewed for the data eye search algorithm. Thus, the data signal DQ 120 may be skewed by opening or closing switches 407 (under the control of the memory controller 300) connected to pullup resistor 420 tied to VDDQ 450, or pulldown resistor 421 tied to ground, to provide high and low noise margins. An additional embodiment, not shown, may include memory controller 300 adjusting a Bus termination voltage VTT connected to the data Bus through a parallel resistor RTT to skew the data signal DQ 120.

Referring to FIG. 2A, FIG. 2B, FIG. 3, FIG. 4A and FIG. 4B, in an embodiment of the present invention the data eye shape is generated by an iterative process of varying both the DQS delay 133 and VREF 225 (delay, VREF). For each step of the iterative process, the memory controller 300 writes and reads a test pattern into/from memory 350. The pattern read from memory is compared using a comparator 420 with some variable VREF 225, i.e., VREFHI 226 through VREFLO 227, and captured using the delayed DQS 130 in a capture flip-flop 311, the resultant signal is then compared with the original pattern. If the original pattern was reproduced, a data point is generated within the data eye envelope for variables (delay, VREF) as shown in FIG. 2B. If the original pattern is not reproduced, the data point for variables (delay, VREF) falls outside of the area encompassed by the data eye.

Alternatively, referring to FIG. 2A, FIG. 2B, FIG. 3, and FIG. 4C, in a further embodiment of the present invention the data eye shape is generated by an iterative process of varying both the DQS delay 133 and a voltage level of the data signal DQ 120 (delay, VDQ). For each step of the iterative process of varying the voltage level of the data signal DQ 120, the memory controller 300 writes and reads a test pattern into/from memory 350. The pattern read from memory is compared using a comparator 420 with a constant voltage VREF 225, and captured using the delayed DQS 130 in a capture flip-flop 311, the resultant signal is then compared with the original pattern. If the original pattern was reproduced, a data point is generated within the data eye envelope for variables (delay, VDQ) as shown in FIG. 2B. If the original pattern is not reproduced, the data point for variables (delay, VDQ) falls outside of the area encompassed by the data eye.

FIG. 5 illustrates a flow chart diagram of a method for DDR device calibration using an algorithm according to an embodiment of the invention. The noise margin testing may involve using a high threshold VREFHI 226 and low threshold VREFLO 227 as shown in FIG. 2B, FIG. 4A, FIG. 4B, and FIG. 5, or a more thorough sweep of VREF voltages from VREFHI to VREFLO if needed (as represented by the 2-dimensional data eye profile shown in FIG. 2B). The method will be described in terms of using high 226 and low 227 VREF thresholds. A more thorough sweep of VREF voltages from VREFHI to VREFLO involves iteratively repeating the method multiple times while varying VREFHI and VREFLO.

With reference to FIG. 2B, FIG. 3, FIG. 4A, FIG. 4B and FIG. 5 the method will now be described. A calibrate command is issued 500 by the memory controller 300 to the MC Data Eye Search State Machine 315 to initialize the two-dimensional data eye search algorithm. The Pattern Generation and Comparison Logic 310 section sets 505 the test pattern and address registers. Memory controller 300 then instructs the Noise Margin Adjustment 340 section and the Variable Delay 320 section to set 505 the initial DQS delay 230 and noise margin skewed in a positive direction (VREFHI 226) for finding the left data eye wall 220A as shown in FIG. 2B. Memory controller 300 then writes 510 a data pattern to memory 350 and subsequently reads 515 a pattern back from memory 350 multiple times. The data patterns read back from memory are compared to VREFHI 226 to yield resultant data patterns. Capture flip-flop 311 captures the multiple resultant patterns retrieved from memory 350 using the delayed DQS 130 and the Generation and Comparison Logic 310 section compares the retrieved resultant patterns with the original pattern to determine if any of the multiple reads fail 520.

If none of the multiple reads fail 520, the memory controller 300 instructs the Variable Delay 320 section to reduce 525 the DQS delay 230 to find the left data eye wall 220A and steps 510, 515, and 520 are repeated.

If any of the multiple reads 520 fails, memory controller 300 then instructs the Noise Margin Adjustment 340 section and Variable Delay 320 section to set 530 the initial DQS delay 230 and noise margin skewed in a positive direction (VREFHI 226) for finding the right data eye wall 221A shown in FIG. 2B. Memory controller 300 then writes 535 a data pattern to memory 350 and subsequently reads 540 a pattern back from memory 350 multiple times. The data patterns read back from memory are compared to VREFHI 226 to yield resultant data patterns. Capture flip-flop 311 captures the multiple resultant patterns retrieved from memory 350 using the delayed DQS 130 and the Generation and Comparison Logic 310 section compares the retrieved resultant patterns with the original pattern to determine if any of the multiple reads fail 545.

If none of the multiple reads fail 545, the memory controller 300 instructs the Variable Delay 320 section to increase the DQS delay 230 to find the right data eye wall 221A and steps 535, 540, and 545 are repeated.

If any of the multiple reads 545 fails and step 555 has not been previously reached, memory controller 300 instructs the Noise Margin Adjustment 340 section and Variable Delay 320 section to set 560 the initial DQS delay 230 and noise margin skewed in a negative direction (VREFLO 227) for finding the left data eye wall 220B shown in FIG. 2B. Memory controller 300 then returns to repeat steps 510–555 to find the left data eye wall 220B and the right data eye wall 221B at VREFLO 227.

If step 555 has been previously reached, then left data eye walls 220A, 220B and right data eye walls 221A, 221B have been determined. The memory controller 300 instructs the Variable Delay 320 to set 565 the DQS delay for the device under test based on the center of the two dimensional window defined by left data eye walls 220A, 220B and right data eye walls 221A, 221B. The calibration procedure then ends 570.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of optimizing delay of a source synchronous clock reference signal (DQS), comprising:

setting an initial test pattern, an address register, a DQS delay, and a reference voltage;

writing the initial test pattern to a memory location, specified by the address register, to form a stored test pattern;

reading the stored test pattern from the memory location specified by the address register to form a read test pattern;

comparing the read test pattern to the reference voltage to form a second read test pattern;

capturing the second read test pattern using the delayed DQS to form a captured test pattern;

comparing the captured test pattern to the initial test pattern to determine if a read error has occurred;

adjusting iteratively the DQS delay and the reference voltage if the read error occurs to find a two-dimensional data eye window; and setting the optimal DQS delay based on the two-dimensional data eye window.

2. The method according to claim 1, wherein the memory is selected from the group consisting of a Double Data Rate Synchronous Dynamic Random Access Memory (DDR SDRAM), a Quad Data Rate (QDR) Memory, Rambus Dynamic Random Access Memory (RDRAM), a register, a cache memory.

3. The method according to claim 1, wherein capturing the second read test pattern includes using a capture flip-flop with the delayed DQS and the second read test pattern as inputs.

4. The method according to claim 1, wherein comparing the read test pattern includes using a comparator with the reference voltage and the read test pattern as inputs.

5. The method according to claim 1, wherein adjusting iteratively the DQS delay and the reference voltage includes setting a high reference voltage and varying the DQS delay to find a first left data eye wall indicated by a read error and a first right data eye wall indicated by a read error, and setting a low reference voltage and varying the DQS delay to find a second left data eye wall indicated by a read error and a second right data eye wall indicated by a read error.

6. The method according to claim 1, wherein adjusting iteratively the DQS delay and the reference voltage includes setting the reference voltage to one of a plurality of reference voltages and varying the DQS delay for each reference voltage of the plurality of reference voltages to find a plurality of left data eye walls indicated by read errors and a plurality of right data eye walls indicated by read errors.

7. The method according to claim 5, wherein setting the optimal DQS delay includes finding a centroid based on the first and second left data eye walls and the first and second right data eye walls.

8. The method according to claim 6, wherein setting the optimal DQS delay includes finding a centroid based on the plurality of left data eye walls and the plurality of right data eye walls.

9. The method according to claim 1, wherein adjusting the reference voltage includes switching between a nominal reference voltage, a high reference voltage, and a low reference voltage.

10. The method according to claim 9, wherein the nominal reference voltage, the high reference voltage, and the low reference voltage are generated by a resistive voltage divider.

11. The method according to claim 10, wherein the resistive voltage divider includes a first resistive bridge switch, a first bridge resistor, a second resistive bridge switch, a second bridge resistor, and a series stub resistor.

12. The method according to claim 10, wherein the resistive voltage divider is contained in a memory controller.

13. The method according to claim 10, wherein the resistive voltage divider is contained in a circuit board under control of a memory controller.

14. An article comprising:
a storage medium having stored thereon instructions that when executed by a machine result in the following
setting an initial test pattern, an address register, a clock reference signal (DQS) delay, and a reference voltage;
writing the initial test pattern to a memory location specified by the address register to form a stored test pattern;
reading the stored test pattern from the memory location specified by the address register to form a read test pattern;
comparing the read test pattern to the reference voltage to form a second read test pattern;
capturing the second read test pattern using the delayed DQS to form a captured test pattern;
comparing the captured test pattern to the initial test pattern to determine if a read error has occurred;
adjusting iteratively the DQS delay and the reference voltage if the read error occurs to find a two-dimensional data eye window; and
setting the optimal DQS delay based on the two-dimensional data eye window.

15. The article according to claim 14, wherein the memory is selected from the group consisting of a Double Data Rate Synchronous Dynamic Random Access Memory (DDR SDRAM), a Quad Data Rate (QDR) Memory, Rambus Dynamic Random Access Memory (RDRAM), a register, a cache memory.

16. The article according to claim 14, wherein capturing the second read test pattern includes using a capture flip-flop with the delayed DQS and the second read test pattern as inputs.

17. The article according to claim 14, wherein comparing the read test pattern includes using a comparator with the reference voltage and the read test pattern as inputs.

18. The article according to claim 14, wherein adjusting iteratively the DQS delay and the reference voltage includes setting a high reference voltage and varying the DQS delay to find a first left data eye wall indicated by a read error and a first right data eye wall indicated by a read error, and setting a low reference voltage and varying the DQS delay to find a second left data eye wall indicated by a read error and a second right data eye wall indicated by a read error.

19. The article according to claim 14, wherein adjusting iteratively the DQS delay and the reference voltage includes setting the reference voltage to one of a plurality of reference voltages and varying the DQS delay for each reference voltage of the plurality of reference voltages to find a plurality of left data eye walls indicated by read errors and a plurality of right data eye walls indicated by read errors.

20. The article according to claim 18, wherein setting the optimal DQS delay includes finding a centroid based on the first and second left data eye walls and the first and second right data eye walls.

21. The article according to claim 19, wherein setting the optimal DQS delay includes finding a centroid based on the plurality of left data eye walls and the plurality of right data eye walls.

22. A memory controller comprising:
a pattern generation and comparison logic section;
a data eye search state machine;
a capture flip-flop;
a variable delay section; and
a noise margin adjustment section, wherein the memory controller instructs the noise margin adjustment section and the variable delay section to set a clock reference signal (DQS) delay and a reference voltage for finding a data eye wall, the memory controller writes an original data pattern to a memory and subsequently reads a data pattern back from the memory, the data pattern read back from the memory is compared to the reference voltage to yield a resultant data pattern, the capture flip-flop captures the resultant pattern retrieved from the memory using the delayed DQS and the generation and comparison logic section compares the retrieved resultant pattern with the original data pattern to determine if the read failed.

23. The memory controller according to claim 22, wherein the memory controller controls a memory selected from the group consisting of a Double Data Rate Synchronous Dynamic Random Access Memory (DDR SDRAM), a Quad Data Rate (QDR) Memory, Rambus Dynamic Random Access Memory (RDRAM), a register, a cache memory.

24. The memory controller according to claim 22, wherein comparing the read data pattern includes using a comparator with the reference voltage and the read data pattern as inputs.

25. A method of optimizing delay of a source synchronous clock reference signal (DQS), comprising:
   setting an initial test pattern, an address register, a DQS delay, and a reference voltage;
   writing the initial test pattern to a memory location, specified by the address register, to form a stored test pattern;
   reading the stored test pattern from the memory location specified by the address register to form a read test pattern;
   comparing the read test pattern to the reference voltage;
   capturing the read test pattern using the delayed DQS to form a captured test pattern;
   comparing the captured test pattern to the initial test pattern to determine if a read error has occurred;
   adjusting iteratively the DQS delay and a voltage level of the captured test pattern if the read error occurs to find a two-dimensional data eye window; and
   setting the optimal DQS delay based on the two-dimensional data eye window.

26. The method according to claim 25, wherein the memory is selected from the group consisting of a Double Data Rate Synchronous Dynamic Random Access Memory (DDR SDRAM), a Quad Data Rate (QDR) Memory, Rambus Dynamic Random Access Memory (RDRAM), a register, a cache memory.

27. The method according to claim 25, wherein capturing the read test pattern includes using a capture flip-flop with the delayed DQS and the read test pattern as inputs.

28. The method according to claim 25, wherein comparing the read test pattern includes using a comparator with the reference voltage and the read test pattern as inputs.

29. The method according to claim 25, wherein adjusting iteratively the DQS delay and the voltage level of the captured test pattern includes setting a high voltage level of the captured test pattern and varying the DQS delay to find a first left data eye wall indicated by a read error and a first right data eye wall indicated by a read error, and setting a low voltage level of the captured test pattern and varying the DQS delay to find a second left data eye wall indicated by a read error and a second right data eye wall indicated by a read error.

30. The method according to claim 25, wherein adjusting iteratively the DQS delay and the voltage level of the captured test pattern includes setting the voltage level of the captured test pattern to one of a plurality of voltage levels of the captured test pattern and varying the DQS delay for each voltage level of the captured test pattern of the plurality of voltage levels of the captured test pattern to find a plurality of left data eye walls indicated by read errors and a plurality of right data eye walls indicated by read errors.

31. The method according to claim 29, wherein setting the optimal DQS delay includes finding a centroid based on the first and second left data eye walls and the first and second right data eye walls.

32. The method according to claim 30, wherein setting the optimal DQS delay includes finding a centroid based on the plurality of left data eye walls and the plurality of right data eye walls.

33. The method according to claim 25, wherein adjusting the voltage level of the captured test pattern includes switching between a nominal voltage level of the captured test pattern, a high voltage level of the captured test pattern, and a low voltage level of the captured test pattern.

34. The method according to claim 33, wherein the nominal voltage level of the captured test pattern, the high voltage level of the captured test pattern, and the low voltage level of the captured test pattern are generated by a resistive voltage divider.

35. The method according to claim 34, wherein the resistive voltage divider includes a first resistive bridge switch, a first bridge resistor, a second resistive bridge switch, a second bridge resistor, and a series stub resistor.

36. The method according to claim 35, wherein the resistive voltage divider is contained in a memory controller.

* * * * *